United States Patent [19]

Fukushima

[11] Patent Number: 4,862,459
[45] Date of Patent: Aug. 29, 1989

[54] TEST METHOD FOR DETECTING FAULTY MEMORY CELL OF A PROGRAMMABLE DEVICE

[75] Inventor: Toshitaka Fukushima, Yokohama, Japan

[73] Assignee: Fujitsu Limited, Kanagawa, Japan

[21] Appl. No.: 904,571

[22] Filed: Sep. 8, 1986

[30] Foreign Application Priority Data

Sep. 9, 1985 [JP] Japan .................................. 60-198761

[51] Int. Cl.[4] ........................................... G01R 31/28
[52] U.S. Cl. ..................................................... 371/21
[58] Field of Search .......................... 371/21; 365/201; 324/73 R, 73 AT, 522, 523, 532

[56] References Cited

U.S. PATENT DOCUMENTS

| | | | |
|---|---|---|---|
| 4,502,131 | 2/1985 | Giebel | 365/201 |
| 4,504,929 | 3/1985 | Takemae et al. | 371/21 X |
| 4,612,630 | 9/1986 | Rosier | 365/201 |
| 4,625,311 | 11/1986 | Fitzpatrick et al. | 371/21 X |

*Primary Examiner*—Charles E. Atkinson

[57] ABSTRACT

For testing unwritten-in field programmable memory cells, some specified written-in cells have been previously provided in the semiconductor device. In the first method, while a readout circuit, which reads datum written in the memory cell, is enabled, addressing-signals selecting the memory cell are switched from the written-in cell to a unwritten-in cell to be tested. Then, the voltage of the bit line operatively connected to the selected unwritten-in cell starts to rise gradually to that of the unwritten-in cell. The delay of this rising voltage, after the moment of the address-switching, is detected by the voltage level at a predetermined time, or by the time when this rising voltage reaches a predetermined threshold level. This delay corresponds to the degradation of the cell by leakage. In the second method, while the readout circuit is disabled, the addressing signals are switched from selecting written-in cell to selecting an unwritten-in cell to be tested, and then the readout circuit is enabled. The delay of the rising bit voltage is detected in the same way as those of the first method, but the time is measured from the moment at which the "enable" signal is applied. These delays can be also detected at the output terminal of the readout circuit.

17 Claims, 6 Drawing Sheets

TIMING CHART OF ADDRESS-SWITCHING

A MEMORY CELL

A TRANSIENT VOLTAGE CHARACTERISTICS
OF A MEMORY CELL

READOUT CIRCUIT AND THE RELATED CELLS

BLOCK DIAGRAM OF A PROM

PROGRAMMING CIRCUIT

TIMING CHART OF ADDRESS-SWITCHING

TIMING CHART OF ENABLE-SWITCHING

TEST METHOD FOR DETECTING FAULTY MEMORY CELL OF A PROGRAMMABLE DEVICE

BACKGROUND OF THE INVENTION

1. Field of the Invention

The present invention relates to a method for detecting a faulty memory cell of a programmable semiconductor device. More particularly, the present invention relates to a method for detecting a delayed access time caused by its degraded isolation resistance of unprogrammed cell.

2. Description of the Related Art

A great many of programmable read only memories made by a semiconductor technology (referred to hereinafter as PROM) have been widely used in the electronic industry, and they can be classified by the type of the memory cells, such as a fuse-blown type, a junction-short type and an insulator-short type. The fuse-blown PROM is that in which the writing-in a memory cell is carried out by applying a high current therein to blow the fuse. The junction-short PROM, so-called diode type, is that in which the writing-in a memory cell is carried out by applying a high current therein to short the reverse p-n junction diode. The insulator-short PROM, so called condenser type, is that in which the writing-in the memory cell is carried out by applying a higher voltage than its break-down voltage to short the insulator made of, for example, a silicon dioxide, in place of the above-mentioned p-n junction diode.

As a representative prior art which supports the explanation of the present invention, a PROM of the p-n junction type shall be hereinafter described in detail. A general concept of a modern PROM of junction-short type is also described by the inventor et al. in a paper "A 40 ns 64 Kbit Junction-Shortening PROM", IEEE JOURNAL OF SOLID-STATE CIRCUITS, VOL sc-19, No. 2, April 1984.

A memory cell of a junction-short type is shown in FIGS. 1. FIG. 1a schematically illustrates a vertically cross sectional view of a memory cell. FIG. 1b shows the equivalent circuit of the cell $M_0$. A diode D, as a programmable element, and a reverse current stopper element Q operatively connected in series, compose the memory cell $M_0$. The diode D is connected in a direction to block the current flow from the bit line. The reverse-current stopper Q is a p-n-p transistor connected in a direction to allow a current to flow from the bit line therethrough and through the diode D. This stopper element Q can be a diode, however, the description shall be given only for the case using a transistor, because the stopper element is not directly concerned with the present invention. As shown in FIG. 1a, the diode D is composed of $n^+$ and $p^+$ diffusion layers fabricated by ordinary n-p-n transistor technology. The p-n-p transistor Q consists of the $p^+$ diffusion layer, which is common to the p-n junction diode, an n-epitaxial layer, and a $p^-$ substrate. An aluminum electrode (not shown in FIG. 1a) is provided as a bit line $B_0$ on the $n^+$ layer which is the cathode of the diode D. The common base of the transistor Q acts as a word line $W_0$.

The memory cell $M_0$ is addressed, namely selected, by applying a high level (referred to hereinafter as H) on the bit line $B_0$ as well as a low level (referred to hereinafter as L) on the word line $W_0$. For programming, namely writing-in an addressed cell, current pulses of 125 mA and 11 micro sec. are applied to the addressed cell through the bit line. This high current not only breaks down the reversely connected diode but also increases the temperature of the jucntion to result in a short. As for reading-out the cell, when a cell is addressed, and if the diode D has been previously shorted, namely programmed (referred to hereinafter as written-in), a current flows form $B_0$ through D and Q to ground. If the diode D is non-conductive, namely not programmed (referred to hereinafter as unwritten-in), the above-metnioned current does not flow. Thus, the stored datum in the cell, "1" or "0", can be readed-out by sensing the existance of this current flow.

In FIG. 1c, there is shown the voltage-current characteristics between $B_0$ and $W_0$ of an addressed unwritten-in memory cell. This characteristics is dominantly affected by the degradation of the reverse diode D by its leakage, because the transistor Q is conductive. The ideal characteristics of a memory cell is shown by the curve (a), where the current is almost nothing as far as the applied voltage is below the breakdown voltage of normal 6 to 7 volt, and sharply increases when the applied voltage exceeds the breakdown voltage. This breakdown is caused by the Zenor-breakdown of the reverse diode D. The curve (b) and (c) show the characteristics of degraded memory cells each having so-called soft breakdown. The leakage is normally caused by lattice defects at the surface or abnormal diffusion. When this current leakage is large or the breakdown voltage is low, it is difficult to distinguish the leaky cell from a written-in cell. And, in a worst case, this results in a reading-out error. Therefore, the leakage below a specified voltage of the reverse diodes must be tested and rejected at the production process of the PROM.

Another problem caused by this leakage of the unwritten-in diode is concerned with the access time, the delay time for reading-out. A leaky unwritten-in cell has a longer access time than that of the normal cell. The mechanism of this delay, the longer access time, is as follows. Before a bit line is addressed, the voltage level of the bit line $B_0$ is L. At a moment at which the bit line is addressed,t he bit line starts to rise up to the H level, receiving a current from a power supply of a voltage $V_{cc}$ through a fixed resistor $R_1$ (FIG. 2). However, each bit line is destined to have a stray capacity $C_0$ parallel to the cell. Because of the time constant of the charging resistor $R_1$ and the stray capacity $C_0$, the voltage rise on the bit line is gradual as shown by the curve $C_1$ in FIG. 3. Then, if the cell has a leakage, the charging current into the capacity is reduced by the amount of the leakage and also the charge in the capacity is lost through this leakage. Accordingly, not only is the voltage at a steady state lower than that of a normal cell, but also the speed of the voltage rise is slower (as shown by the curve $C_2$) than that of a normal cell (as shown by the curve $C_1$). The access operation of a memory cell is completed when the bit line reaches the threshold level, and the output level of the output buffer is changed. Thus, a leaky cell results in a longer delay of completion of the access operation than that of the normal cell.

When the integration of PROM was not as large and the access time was not as severe as todays, the access delay caused by a small leakage as above mentioned was not very serious. However, as the PROM became larger in memory capacity, the variation of characteristics of the cells became larger, and the probability of producing cells having a small leakage, like curve (b), has is also increased. Therefore, amethod to effectively detect the faulty cell caused by a small leakage must be imperatively established.

In general, in order to discriminate a leaky cell, a DC (direct current) test may be used, where a limiting current level, as shown by TL in FIG. 1c, is specified. However, the value of TL can not be reduced as much as required, because the possible lowest value of TL is limited by the peripheral circuit in use.

The reason why the detectable lowest leakage current is limited is as follows. The constitution of a typical PROM is shown by the block diagram in FIG. 4. The output terminal $O_0$ is used in three ways, namely for reading-out, writing-in and testing. Testing of a cell is done by applying a voltage on the output terminal $O_0$ in order to inject a current from an external tester, and sensing the current flowing thereinto. The number of output terminals that are provided that as many as the number of readed-out bit lines, but only one terminal $O_0$ is referred to, because the one terminal is enough to explain the principle of the cell test. PROG shown in FIG. 4 denotes a programming circuit, a circuit for writing-in a cell. A circuit diagram relating to one memory cell of the programming circuit PROG is schematically illustrated in FIG. 5 in detail. Further in FIG. 4, XADD denotes a X-address buffer, and D/D denotes a decoder/driver all of which are equivalent to the word driver $\overline{WD}$ in FIG. 5. YADD denotes a Y-address buffer, which, in case of reading-out, controls the multiplexer MPX to select the bit line of the cell to be readed-out, as well as in case of writing-in, and controls the programming circuit PROG to select the bit line to the cell to be written-in. CE denotes a circuit for enabling, namely activating, the output buffer $\overline{OUT}$, at a chip-enable state. TW and TB denote respectively a test word line and a test bit line, by each of which test cells are operatively connected to be addressed. These test cells are written-in cells which have been provided in addition to the ordinary memory cell for testing purpose.

Function of the programming circuit PROG, used for testing a cell, is described hereinafter. As shown in FIG. 5, the circuit PROG is composed of transistors $Q_1$, $Q_2$ mutually in a Darlington connection, a resistor R, a diode $D_1$ both of which are for pulling up the collectors of these transistors to a power source $V_{cc}$, and a constant-current power source CS. (If the collectors are floated without being pulled-up, a parasitic capacity of the collectors may cause a malfunction of the circuit.) The output terminal is operatively connected to the collectors of the Darlington circuit through a diode $D_2$, which prevents a current from flowing toward the outside. In this circuit, when the word line $W_0$ is addressed by the word decoder $\overline{WD}$ as well as the bit line $B_0$ is addressed by $NAND_1$ controlled by the combination of signals in Y-address buffer YADD, the transistors become conductive by a current $I_1$(0.3 mA) supplied from the current source CS. Thus a current $I_2$ from the power source $V_{cc}$ through the resistor R and the diode $D_1$, together with the current $I_1$, are ready to flow into the bit line $B_0$. The resistor R is of approximately 1 K ohm, for example, so the current $I_2$ is of approximately 2 mA. At this state, if the addressed cell $M_0$ is conductive, namely previously written-in or having a defectively large leakage, the current $I_1+I_2$ flows into the bit line $B_0$. If the addressed cell $M_0$ is unwritten-in, this current does not flow thereinto. As previously described, the test of the cell is done by sensing a current flowing into the terminal $O_0$ while injecting a current into this terminal from an external tester. However, if the leakage current of the cell under test is as low as $I_1+I_2$, no current can flow into the terminal $O_0$, because the current $I_1+I_2$ is already supplied from other sources. Thus, at the terminal $O_0$ the external tester can only detect a current of more than $I_1+I_2$. This means that the lowest detectable level of the leakage current of the cell is $TL=I_1+I_2$. Therefore, if its leakage current is lower than $I_1+I_2$ the above-described DC method can not detect a faulty cell whose access time is so long as can not be disregarded.

SUMMARY OF THE INVENTION

It is an object of the present invention to provide a method for detecting and rejecting a faulty unwritten-in PROM cell having an access delay caused by a leakage current which can not be effectively detected by a DC method.

In order to embody the present invention, some specified memory cells of a PROM under test have been previously written-in.

While a readout circuit is enabled, input signals to address a written-in cell is switched so as to address an unwritten-in cell, so that a delay of voltage produced on the bit line of the addressed unwritten-in cell is detected in comparison with the applied addressing pulse. Alternatively, while the readout circuit is disabled, input signals to address a written-in cell are switched so as to address an unwritten-in cell, and successively the readout circuit is enabled, so that a delay of a voltage produced on the bit line of the addressed unwritten-in cell is detected in comparison with the application of the enabling signal. Faulty cell is discriminated by the degree of above-mentioned delay, an access delay.

The above-mentioned features and advantages of the present invention, together with other objects and advantages, which will become apparent will be more fully described hereinafter.

DESCRIPTION OF THE PREFERRED EMBODIMENTS

Figure 2:
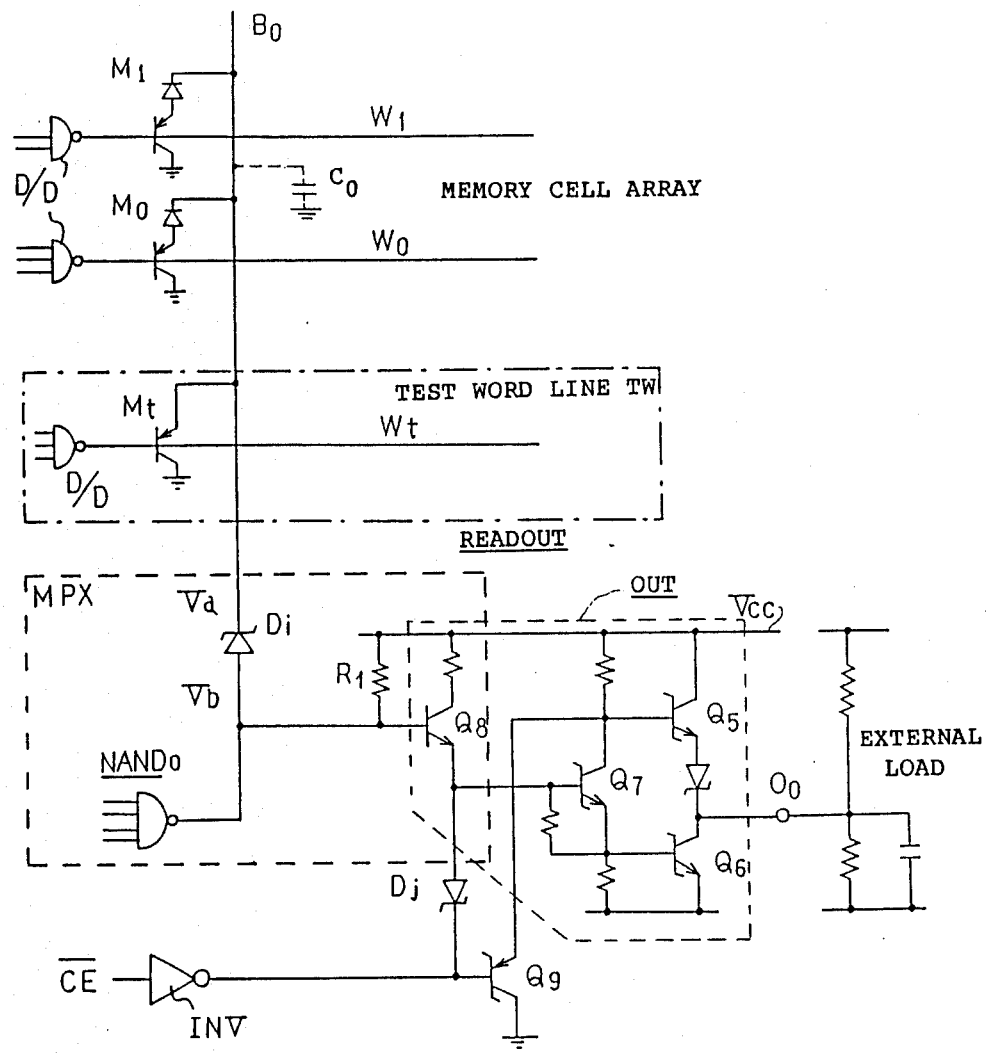
FIG. 2 shows a readout circuit and the related cells of a PROM on which the present invention is embodied.

Referring now to FIG. 2, there is shown the readout circuit and the related circuits for the method embodying the present invention. $Q_5$, $Q_6$ denote transistors of an output stage. $Q_7$ denotes a driver transistor. $Q_8$, $Q_9$ denote transistors of the input stage. These five transistors compose an output buffer $\overline{OUT}$, which also acts as an inverter. The multiplexer MPX is composed of NAND gate $NAND_0$, a Schottky barrier diode $D_i$, a resistor $R_1$ and a transistor $Q_8$. Each set of multiplexer is provided for each bit line respectively. A multiplexer and the output buffer compose a readout circuit $\overline{READ\ OUT}$. There are many word lines and bit lines in a PROM, however the word lines $W_0$, $W_1$, $W_t$, bit line $B_0$ and their related memory cells shall suffice to illustrate the embodiment of the present invention, representing other word lines, bit lines and their related circuits. When the PROM chip is selected, namely the readout circuit is enabled, the chip-enable signal $\overline{CE}$ is of a L level. Thus the output of the inverter INV is of a H level, resulting in turning off the p-n-p transistor $Q_9$. In addition to this condition, if the NAND gate $NAND_0$ delivers an H level to select the bit line $B_0$, the output signal $O_0$ of the output buffer $\overline{OUT}$, an inverter, falls to L corresponding to the signal $\overline{H}$ of the bit line $B_0$. In other words, if the addressed cell is non-conductive, thus the voltage $V_b$, which is always of the same logic level to the voltage $V_a$ on the bit line $B_0$, is H, the transistors $Q_8$, $Q_7$ and $Q_6$ are conductive and the transistor $Q_5$ is non-conductive resulting in delivering L on the output terminal $O_0$. And, if the addressed cell is conductive, thus $V_b$ is L, the transistors $Q_8$, $Q_7$ and $Q_6$ are non-conductive and the transistor $Q_5$ is conductive resulting in delivering H on $O_0$.

At the fabrication of the PROM, the memory cells which are programmable by a PROM-user at field, are of course non-conductive, as well as the test cells which are used for testing the programmable unwritten-in cell are made conductive according to the pre-determined layout scheme. These test cells have been provided in addition to the field programmable cells, originally for testing the peripheral circuits installed in the chip of PROM. Details of testing the peripheral circuits in a PROM by using the written-in test cells were disclosed by the inventors et al. in the U.S. Pat. No. 4,320,507, "FIELD PROGRAMMABLE DEVICE HAVING TEST PROVISIONS FOR FAULT DETECTION", filed Nov. 19, 1979 and the U.S. Pat. No. 4,429,388, "FIELD PROGRAMMABLE DEVICE WITH INTERNAL DYNAMIC TEST CIRCUIT", filed Dec. 8, 1980. $M_t$ denotes a written-in, conductive, test cell. $W_t$ denotes a word line operatively connecting bases of stopper transistors of the test cells. As a simple example of the layout scheme of the written-in test cells, all the cells connected to the single word line $W_t$ may be written-in.

Figure 1:
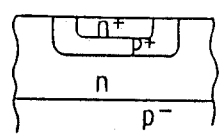
FIGS. 1a, 1b and 1c schematically illustrate a memory cell of a junction-short type, as an example of programmable cell types.
Figure 1:
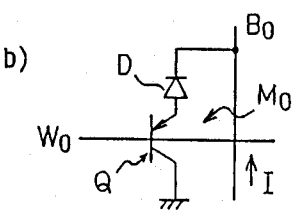
Figure 1:
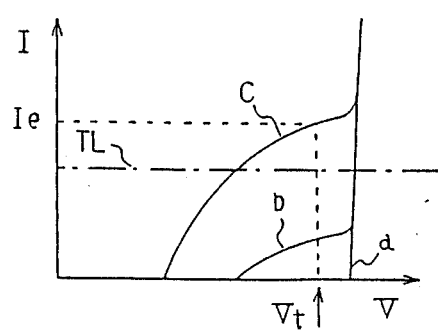
Figure 3:
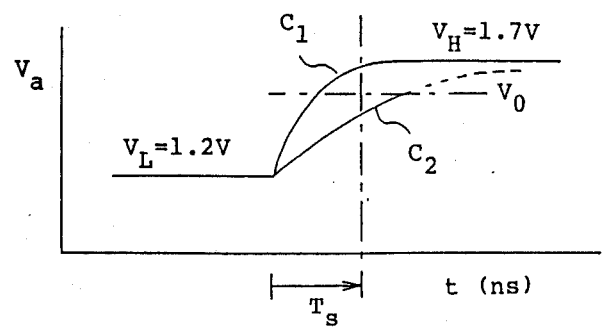
FIG. 3 shows a transient voltage characteristics of an unwritten-in memory cell when switched from a low level of written-in cell.

When the written-in memory cell $M_t$ is addressed, the voltage $V_a$ of the bit line $B_0$ becomes, L level (the value denoted as $V_L$), namely approximately 1.2 V, which is a voltage drop across the conductive transistor of the written-in cell. The value 1.2 V is the sum of the approximately 0.5 V, an addressing level, delivered from the decoder/driver D/D and approximately 0.7 V, a voltage drop $V_{BE}$ across base-emitter of the stopper transistor. The voltage $V_a$ is produced by the current flowing from the power source $V_{cc}$ through the resistor $R_1$ and the diode $D_i$. Then, the voltage $V_b$ is 1.6 V which is 0.4 V (the forward drop $V_f$ of the diode $D_i$) higher than that of $V_a$. However, this 1.6 V of $V_b$ is not high enough to make the transistors $Q_8$, $Q_7$ and $Q_6$ conductive, because the threshold voltage to trigger the transistor $Q_8$ is approximately 1.9 V which is the sum of each base-emitter voltage which begins to make each of these three transistors conductive. At this state, the output $O_0$ is H. When the unwritten-in cell $M_9$ is addressed, no current flows into the bit line $B_0$, resulting in reduced current flowing through the resistor $R_1$. This reduced current produces a reduced voltage drop across the resistor $R_1$. Thus, the voltage $V_b$ rises up as high as approximately 2.1 V, which is the sum of these three base-emitter voltage drops receiving the current from the resistor $R_1$. The voltage $V_b$ is clamped at this voltage. The voltage $V_a$ is 1.7 V, a H level (the value denoted as $V_H$), which is $V_b$ less 0.4 V ($=V_f$), and, the transistors $Q_8$, $Q_7$ and $Q_6$ are conductive, resulting in an on the output terminal $O_0$. Time variation of the voltage $V_a$ of the bit line $B_0$, a transient voltage against time, is illustrated in FIG. 3. If the written-in test cell $M_t$ has been addressed, the voltage $V_a$ of the bit line $B_0$ is $V_L$. Then, at this state, if the addressed cell is switched to the programmable unwritten-in cell $M_0$, the $V_a$ starts to rise up to $V_H$. If the addressed cell is a normal cell having sufficiently little leakage, the rising up of the $V_a$ is fast as shown by the curve $C_1$. However, if the cell is faulty having a leakage, the rising-up is slow, or delayed, as shown by the curve $C_2$, which means it takes a long access time. (If the leakage is very large, no voltage rises up, which does not distinguished it from a written-in cell.) Therefore, a faulty cell having a long access time caused by its leakage can be discriminated by checking the voltage level of $V_a$ in comparison with a predetermined threshold level, for example $V_0$ in FIG. 3, measured at a predetermined moment $T_s$, for exmaple 50 ns after the signal to switch the cell-addressing is applied. In FIG. 3, the curve $C_1$ passing beyond $V_0$ at $T_s$ means "normal", and the curve $C_2$ passing below $V_0$ at the same moment means "faulty". A practical way of checking the delay are hereinafter described using the timing chart in some detail.

Figure 6:
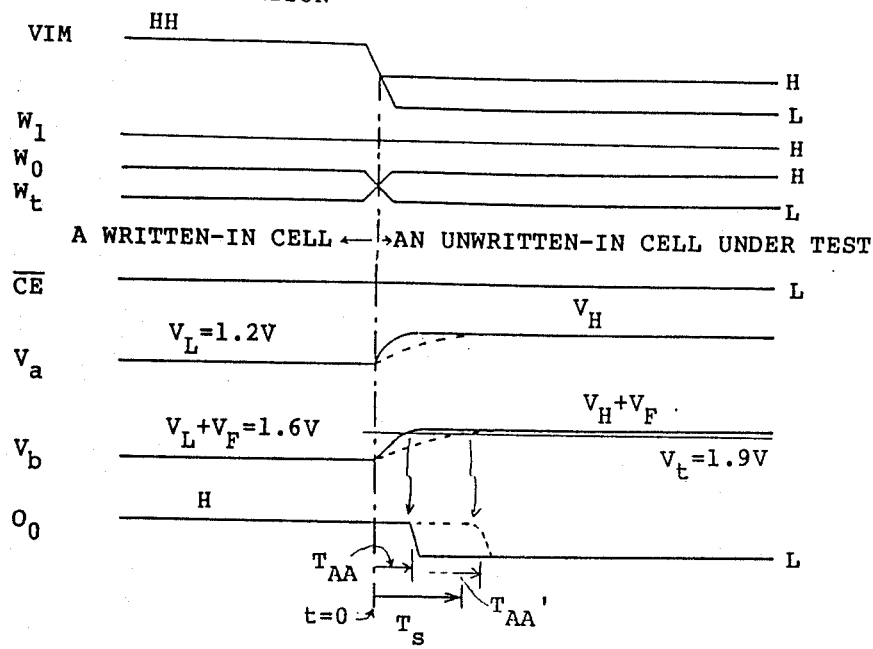
FIGS. 6a and 6b show timing charts for explaining the test method using address-switching according to the present invention.
Figure 6:
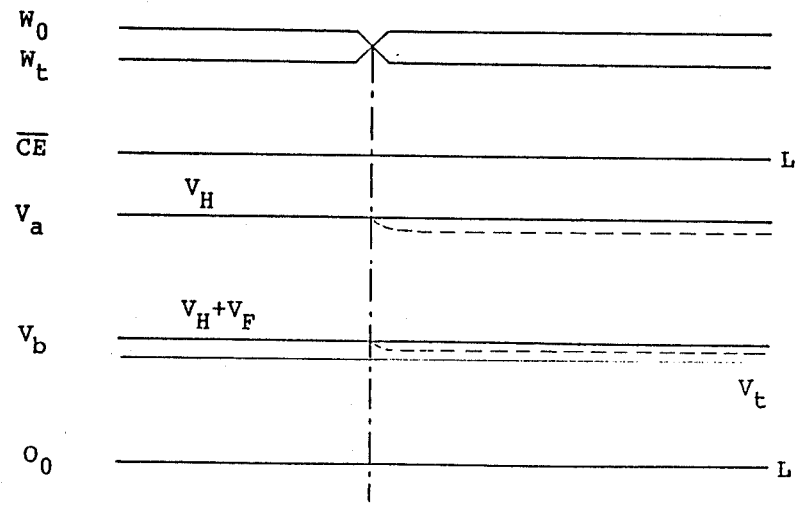

Referring to FIG. 6, the functions of these testing method are described in more detail. FIG. 6a illustrates timing charts of address-switching from a written-in cell to an unwritten-in cell according to the present invention. FIG. 6b illustrates timing charts of address-switching from an unwritten-in cell to another unwritten-in cell without the method according to the present invention. As for FIG. 6a, application of the signal VIM inhibits all the field programmable unwritten-in cells while addressing a word line or a bit line which accesses written-in test cells. The signal VIM has three levels L, H and HH. The HH is 10 V, for example. Function of the signal VIM shall not be discussed here in any more detail, because it is not essential to describe the present invention, but the details are disclosed by the inventor et al. in the Japanese Patent No. 1217316, "Logic Circuit for Test Bit Selection" registered July 17, 1984, (the examined patent publication No. Toku-58-053440, Nov. 29, 1983). A written-in test cell has been addressed until a moment (defined as t=0), (referred to hereinafter to as a first moment) shown by the chain line, at which moment the addressing is switched so as to access an unwritten-in cell. When a written-in cell is addressed, the signal $V_a$ on its bit line $B_0$ is $V_L$, the signal $V_b$ is $V_L+V_F$, and the output signal $O_0$ is H. At the steady state after an unwritten-in cell is addressed, the signal $V_a$ on the bit line is $V_H$, the signal $V_b$ is $V_H+V_F$ and the output signal $O_0$ is L. When the diode of the addressed unwritten-in cell has a leakage, the signal $V_a$ rises as shown by a dotted line more slowly than that of the normal cell shown by a solid line. And, when the signal $V_b$, having the same trend as $V_a$, reaches the threshold level $V_t$, the output signal $O_0$ falls from H to L. Thus the moment, denoted as the second moment, at which the output signal falls to L is detected and measured by the external tester. The delay of this second moment in regard to the first moment at which the address pulse is applied to the written-in cell is called an access time, or $t_{PHL}$. In FIG. 6a, the access time is defined by the moment at which the solid line of the normal cell reaches $V_t$, the time $t_{AA}$. The access time of a leaky cell is defined by the moment at which the dotted line reaches $V_t$, the time $t_{AA}'$. Thus, the access time is easily detected and measured by an external tester, so the access time can be specified in the test terms in order to discriminate a faulty cell.

There is another way to specify the delay of the access time as an alternative to the above-mentioned method. This way specifies logic level H or L of the signal $V_b$ at a specified moment $T_s$, in comparison with the threshold level $V_t (=1.9 \text{ V})$ at which the transistor $Q_8$ turns from "non-conductive" to "conductive" as mentioned before. The logic level L or H of this signal $V_b$ is correspondingly delivered to the logic level H or L of the output terminal $O_0$ and accordingly can be detected also by the external tester. Namely, the buffer OUT acts also as a comparator. Therefore, the logic level of the output terminal $O_0$ at a predetermined time $T_s$ in FIG. 6 can be specified as the test terms in order to discriminate a faulty cell. The smaller value of $T_s$ can check the least delay time of the cell.

On the other hand, all the user-programmable cells are, of cause, unwritten-in until a user writes-in the cell. Therefore, without using a written-in cell, if the address switching is done from an unwritten-in cell $M_0$ to another unwritten-in cell $M_1$, the voltage $V_a$ of the bit line $B_0$ are essentially the same, or changes much less than that of the present invention. Namely, if the cells are not leaky at all, the voltage is kept at the same $V_H$. If the newly addressed cells is leaky, the voltage drop determined by the value of the leakage is observed as shown by the dotted lines in FIG. 6b. However, the voltage drop affected on $V_b$ is not large enough to trigger the output circuit OUT. So, discriminating of faulty cell is difficult. However, in contrast with this difficulty in discriminating faulty cells, according to the method of the present invention using a written-in cell, there can be produced an evident changes of voltages $V_a$ and $V_b$, as above-described. Therefore, when the addressing of the written-in cell and unwritten-in cell is switched, reliable discriminating of the faulty cells can be achieved.

There is another method of address-switching. Namely, first, the readout circuit READOUT, composed of the multiplexer MPX and the output buffer OUT, is disabled. Second, the addressing is switched from a written-in cell to an unwritten-in cell to be tested. Third, the readout circuit is enabled. Fourth, the delay of output signal from the moment of applying the address switching pulse is measured. Comparison of this second method with the first method is shown in the following table for easier understanding.

| steps | METHODS OF ADDRESS SWITCHING | | | |
|---|---|---|---|---|
| | first method | | second method | |
| | | output | | output |
| *chip-enable | enabled | — | disabled | — |
| *addressing | writt. cell | — | writt. cell | — |
| *address-switching to | unwrit. cell | changes | unwrit. cell | — |
| *chip-enable | same | — | enabled | changes |

Figure 7:
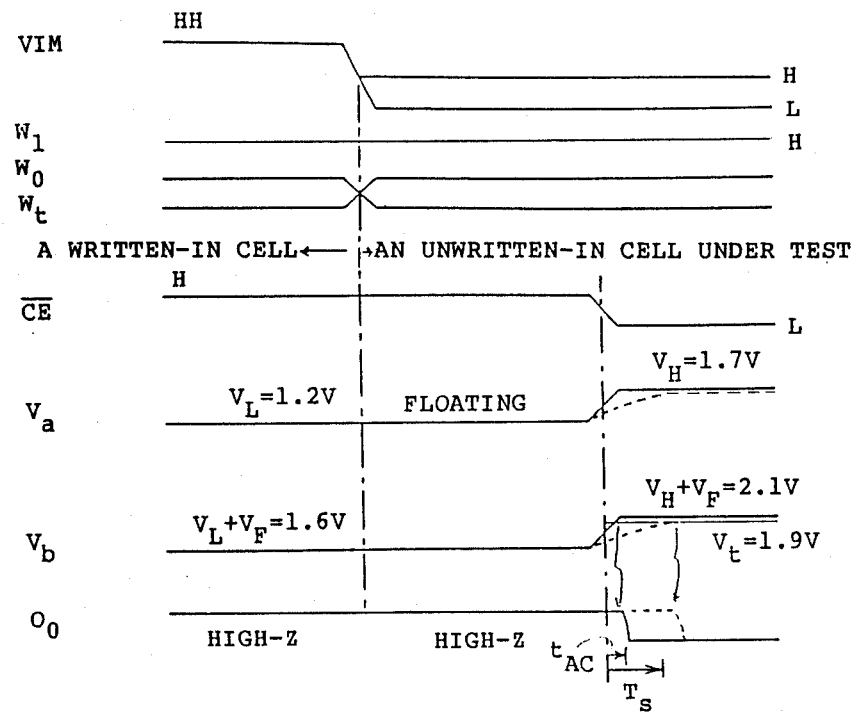
FIGS. 7a and 7b show timing charts for explaining the test method using enable-switching according to the present invention.
Figure 7:
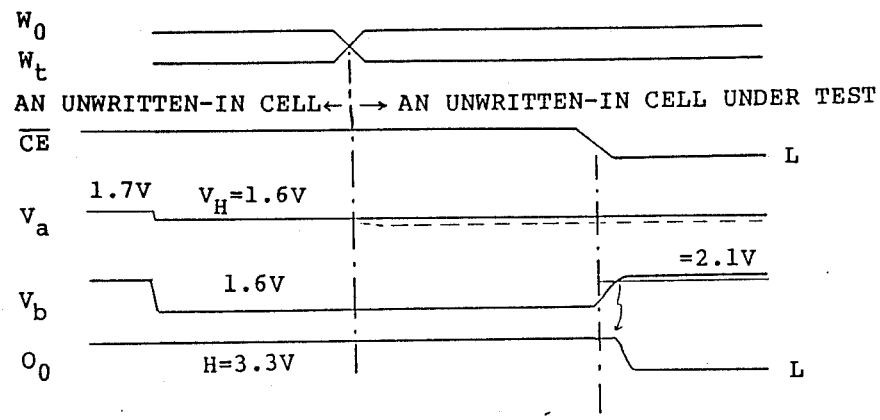

Referring to FIG. 2, the function of the chip-enable signal is explained first. When the chip-enable signal $\overline{CE}$ is H, meaning chip-disabling, the output of the inverter INV is L, so the transistor $Q_9$ is conductive, $Q_5$ is non-conductive, and the emitter of the transistor $Q_8$ is clamped to the L level of the inverter INV through the diode $D_j$. Accordingly, the transistor $Q_7$ and $Q_6$ are non-conductive, therefore, the state of the output terminal $O_0$ is high-Z (a high impedance). In other words, the transistors $Q_5$, $Q_6$ operatively connected to the output terminal $O_0$ are both non-conductive, keeping the output terminal $O_0$ floating. (The output level is determined only by external circuits operatively connected to this terminal $O_0$). This type of circuit is called a tri-state structure, delivering H, L and high-Z. At the high-Z state, the voltage $V_b$ is 1.6 V, which is the sum of 0.5 V (L level of INV out), 0.4 V (forward drop $V_F$ of the diode $D_j$) and 0.7 V ($V_{BE}$ of transistor $Q_8$). Further, at this state, if a written-in cell $M_t$ is addressed, its bit line voltage is 1.2 V, which is equivalent 1.6 V ($V_b$) less 0.4 V ($V_F$). While the readout circuit is disabled, if an unwritten-in normal cell is addressed, its bit line $B_0$ becomes floating, because the voltage $V_b$ is kept pulled down to 1.6 V by L of the INV output through $D_j$ and $V_{BE}$ of transistor $Q_8$, letting the diode $D_i$ be non-conductive. However, if the unwritten-in normal cell is addressed successively after addressing a written-in cell, the bit line $B_0$ holds the voltage 1.2 V of the previous state that is addressing the written-in cell, because the voltage is held by the charge of the stray capacity $C_0$ of the bit line. At this state where an unwritten-in cell has been addressed, if the readout circuit is switched so as to be enabled by applying L for $\overline{CE}$, the H output of the INV turns off the transistor $Q_9$ as well as pushes the voltage $V_b$ up to 2.1 V through diode $D_j$ and the transistor $Q_8$. Thus, the voltage $V_a$ rises up to $V_H$, 1.7 V, which is $V_b$ less $V_F$. However, if the cell is leaky, the voltage $V_a$ and $V_b$ rise slowly as shown by the dotted lines in FIG. 7a and FIG. 3. Accordingly, the falling of the output $O_0$ from H to L is delayed as shown also by a dotted line. Using an external tester, the moment of the falling of the output signal can be measured as an access delay time from the moment of applying enable signal pulse $\overline{CE}$. This delay time is called chip-enable access time, $t_{AC}$ or delay from high Z to L, $t_{PZL}$, and specified in the test specification. This access delay can be also checked by reading signal level H or L of the output terminal $O_0$ at a predetermined time $T_s$. The shorter $T_s$ is, the smaller the leakage that can be checked. Accordingly, $T_s$ is a test condition in a specification to check a faulty cell cause by its degraded isolation.

In the case without using the method according to the present invention, addressing is at first switched from an unwritten-in cell to another unwritten-in cell and successively the readout circuit is switched from "disable" to "enable". The voltage $V_b$ is 1.6 V, and the voltage $V_a$ is also approximately 1.6 V, because this value was 1.7 V of the previous enabled state and now the voltage drop $D_F$ of the diode $D_i$ is nearly zero or reversly biased. The voltage $V_a$ is determined by the amount of the leak, as shown by the dotted line in FIG. 7b. And, at this state, if the readout circuit is enabled, the voltage $V_b$ can rise up to 2.1 V quickly, charging the voltage difference of $V_a$ which rises up from 1.6 V to only 1.7 V. Accordingly, it is very difficult to detect a faulty cell by detecting the difference of the rising voltage.

An advantage of the above-described second method using "enabling" of the readout circuit over the first method using only address-switching is that the applied voltage difference upon the unwritten cell is certainly obtained by "enabling" the readout circuit after address switching is completed. At the first method, the voltage $V_a$ on the written-in cell may rise for some degree while the addressing is passing other cells before reaching a destination unwritten-in cell. This unexpected voltage rise of $V_a$ causes less voltage difference to be applied on the unwritten-in cell to be tested, resulting in a less sensitive detection of a faulty cell. However, at the second method, the address switching is carried out, without voltage supplied to the bit line, during the "disabling" period. Thus, the voltage difference is always secured.

The specified test condition is very equivalent to the practical application. Access time of the normal cells are distributing below 50 ns. However, faulty cells having small leakage are distributed near 70 ns in a group, which proves that the sorting of the faulty cell is achieved easily and reliably. The written-in cells have been previously provided in the PROM cells for testing the peripheral circuits therein as cited above. Therefore, no additional provision of written-in cell nor circuit is required in the chip or in the external test equipment for the test by the present invention, but only some addition test programming is required. Accordingly, the cost increase for embodying the present invention is almost nothing. However, according to the present invention, a leaky cell which causes access delay but could not be detected by the prior art is quite easily and quite reliably detected, resulting in an improvement of quality control in the factory and also improvement of writing-in ratio at the field.

Although the junction-short type PROM is referred to in the description of the embodiment of the present invention, it is apparent that other embodiments, such as of fuse-blown type, insulator-short type and others, and modification of the invention are possible.

Although the description of the preferred embodiment was given concerning the address switching from addressing a written-in cell to addressing an unwritten-in cell, according to the present invention, it is apparent that the address-switching from addressing an unwritten-in cell to addressing a written-in cell is also possible, when a different kind of peripheral readout circuit, such as reading-out the word lines, is used.

Figure 4:
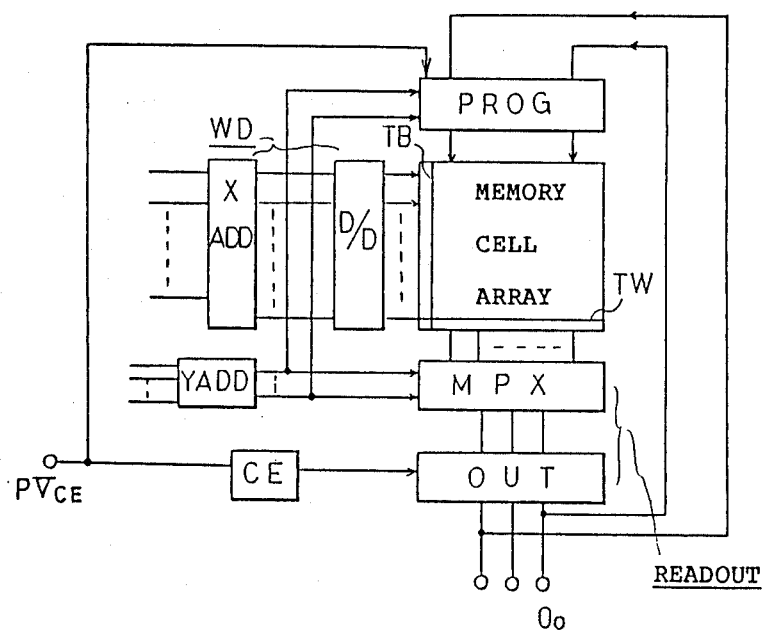
FIG. 4 shows a block diagram of a PROM.
Figure 5:
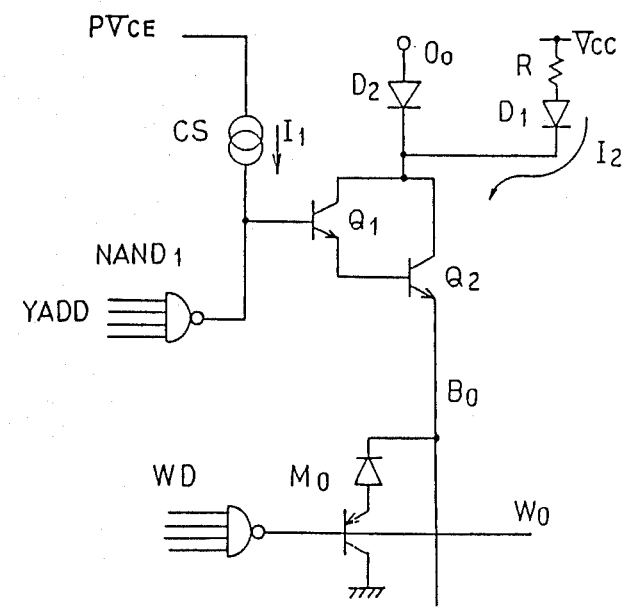
FIG. 5 shows a circuit diagram of the programming circuit.

Although the description of the preferred embodiment was given concerning the address switching on a single bit line, according to the present invention, however, address-switching can be possible between different bit lines. Because the memory cells on a single word line can be all written-in cells, as a test word line shown in FIGS. 2 and 4, then voltage $V_a$ on all the bit line can be simultaneously pulled down to 1.2 V. Similar things can be said for all memory cells which are connected with a single bit line are written-in as shown in FIG. 4.

Although in the above-described preferred embodiment the address-switching and enable-swiching are both initiated by external signals, it is apparent that, according to the present invention, the switching can be also initiated automatically by a built-in circuit or built-in program on the chip, respecitvely.

Although in the above-described preferred embodiment the readout circuit is a buffer acting also as a comparator/inverter, it is apparent that at least one of or combination of a computer, an inverter, an amplifier or a flip-flop can be used for the readout circuit.

Although in the above-described preferred embodiment the detection of the variation of the bit line is carried out at the output terminal of the readout circuit, it is apparent that the detection can be also carried out by measuring the voltage of inner circuits by probes. In this case, the threshold level can be independently specified from the threshold level of the readout circuit.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What we claim is:

1. A method for testing a programmable semiconductor device having unwritten-in cells for field-programming as well as previous written-in cells for test, said method comprising the steps of:
    (a) switching an application of a current between a first cell to be tested and a second cell, said first and second cells being one of the unwritten-in cells and one of the written-in cells respectively;
    (b) detecting a variation of a voltage induced across said first cell within a predetermined time period after said switching; and
    (c) comparing said detected variation of the voltage with a predetermined threshold level, whereby a detected variation of the voltage lower than said predetermined threshold level indicates a faulty cell.

2. A method according to claim 1, wherein said switching cited in said step (a) is carried out by firstly selecting the written-in cell and secondly selecting the unwritten-in cell.

3. A method according to claim 1, wherein said switching cited in said step (a) is carried out by firstly selecting the unwritten-in cell and secondly selecting the written-in cell.

4. A method according to claim 1, wherein the programmable semiconductor device comprises a readout circuit which is provided for sensing a state of a selected cell, and
    said variation of voltage cited in said step (b) is made available by said switching cells cited in said step (a) while enabling said readout circuit.

5. A method according to claim 2 or 3, wherein said switching is carried out by changing address input signals for addressing a cell.

6. A method according to claim 1, wherein said voltage cited in said step (b) is a voltage on a bit line of a cell selected by said step (a).

7. A method according to claim 1, wherein said voltage cited in said step (b) is a voltage on a word line of a cell selected by said step (a).

8. A method according to claim 1, wherein the programmable semiconductor device comprises a readout circuit which is provided for sensing a state of a selected cell, and
    said variation of voltage cited in said step (b) is unavailable while said readout circuit is disabled, and is made available by enabling said readout circuit.

9. A method according to claim 8, wherein said enabling a readout circuit is carried out by a chip-enable signal which enagles as well as disables the output of the device.

10. A method according to claim 9, wherein said moment at which said variation of voltage starts is defined by a moment at which an enabling of said readout circuit is initiated.

11. A method according to claim 1, wherein said detecting the variation of voltage is carried out at an output terminal of the device through at least one of comparators which convert said varying voltage of an analogue signal to a binary output signal, whereby said variation of voltage is measured binarily by an external testing means.

12. A method for testing a programmable semiconductor device having unwritten-in cells for field-programming as well as previously written-in cells for test, said method comprising the steps of:
(a) switching on application of a current between a first cell to be tested and a second cell, said first and second cell being one of the unwritten-in cells and one of the written-in cells respectively;
(b) detecting a rise-time for which a voltage induced across said first cell reaches a predetermined threshold voltage, said rise-time being measured after said switching; and
(c) comparing said detected rise-time with a predetermined specification rise-time, whereby a rise-time longer than said predetermined specification rise-time indicates a faulty cell.

13. A method according to claim 12, wherein said switching cited in said step (a) is carried out by firstly selecting the written-in cell and secondly selecting the unwritten-in cell.

14. A method according to claim 12, wherein said switching cited in said step (a) is carried out by firstly selecting the unwritten-in cell and secondly selecting the written-in cell.

15. A method according to claim 12, wherein the programmable semiconductor device comprises a readout circuit which is provided for sensing a state of a selected cell, and
said variation of voltage cited in said step (b) is made available by said switching cells cited in said step (a) while enabling said readout circuit.

16. A method according to claim 12, wherein said switching is carried out by changing address input signals for addressing a cell.

17. A method according to claim 12, wherein said detecting the rise-time is carried out at an output terminal of the device through at least one of comparators which convert said varying voltage of an analogue signal to a binary output signal, whereby said variation of voltage is measured binarily by an external testing means.

* * * * *